(12) United States Patent
Bae et al.

(10) Patent No.: US 12,457,847 B2
(45) Date of Patent: Oct. 28, 2025

(54) DISPLAY DEVICE AND METHOD OF PROVIDING THE SAME

(71) Applicant: Samsung Display Co., LTD., Yongin-si (KR)

(72) Inventors: Kwang Soo Bae, Yongin-si (KR); Gee-Bum Kim, Seoul (KR); Dae-Young Lee, Seoul (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 722 days.

(21) Appl. No.: 17/870,938

(22) Filed: Jul. 22, 2022

(65) Prior Publication Data

US 2023/0147614 A1    May 11, 2023

(30) Foreign Application Priority Data

Nov. 10, 2021 (KR) .................... 10-2021-0154317

(51) Int. Cl.
*H10K 50/86* (2023.01)
*G06F 3/041* (2006.01)
(Continued)

(52) U.S. Cl.
CPC ........... *H10K 50/86* (2023.02); *G06F 3/0412* (2013.01); *H10K 50/844* (2023.02);
(Continued)

(58) Field of Classification Search
CPC .... H10K 50/844; H10K 50/856; H10K 50/86; H10K 59/1201; H10K 59/121;
(Continued)

(56) References Cited

U.S. PATENT DOCUMENTS 7,268,485 B2     9/2007  Tyan et al.
2011/0284881 A1* 11/2011 Shikina ............... H10K 59/879
                                                257/E27.121
(Continued)

FOREIGN PATENT DOCUMENTS

KR    20150063862 A    6/2015
KR    20180125673 A   11/2018
(Continued)

OTHER PUBLICATIONS

English translation of KR-20200081911-A (Year: 2020).*
Korean Written Opinion for Korean Patent Application No. 10-2021-0154317 dated Jun. 23, 2025.

*Primary Examiner* — Shaun M Campbell
(74) *Attorney, Agent, or Firm* — CANTOR COLBURN LLP

(57) ABSTRACT

A display device includes a base substrate, a light emitting element layer including a central non-emitting area, an emitting area surrounding the central non-emitting area, and a peripheral non-emitting area surrounding the emitting area, an encapsulation layer covering the light emitting element layer, and a light blocking layer on the encapsulation layer. The light blocking layer includes a first light blocking layer defining a first opening overlapping the emitting area, and a second light blocking layer in the first opening and spaced apart from the first light blocking layer.

18 Claims, 19 Drawing Sheets

(51) Int. Cl.
   *H10K 50/844*   (2023.01)
   *H10K 59/12*    (2023.01)
   *H10K 59/122*   (2023.01)
   *H10K 59/40*    (2023.01)
   *H10K 71/00*    (2023.01)

(52) U.S. Cl.
   CPC ........... *H10K 59/122* (2023.02); *H10K 71/00* (2023.02); *H10K 59/1201* (2023.02); *H10K 59/40* (2023.02)

(58) Field of Classification Search
   CPC .. H10K 59/122; H10K 59/40; H10K 59/8792; H10K 71/00; G06F 3/0412
   See application file for complete search history.

(56) References Cited

U.S. PATENT DOCUMENTS

| | | | |
|---|---|---|---|
| 2012/0133682 A1* | 5/2012 | Kawano | G09G 3/3233 345/690 |
| 2015/0155347 A1 | 6/2015 | Baek et al. | |
| 2018/0331316 A1 | 11/2018 | Lee et al. | |
| 2019/0115404 A1 | 4/2019 | Moon et al. | |
| 2021/0036263 A1* | 2/2021 | Kim | H10K 50/86 |
| 2021/0202594 A1* | 7/2021 | Jo | H10K 59/121 |
| 2021/0265537 A1* | 8/2021 | Shin | H10K 59/12 |

FOREIGN PATENT DOCUMENTS

| | | | | |
|---|---|---|---|---|
| KR | 20190041558 A | | 4/2019 | |
| KR | 1020190055417 A | | 5/2019 | |
| KR | 20200081911 A | * | 7/2020 | ............ H10K 50/84 |
| KR | 1020210008265 A | | 1/2021 | |
| KR | 20210078931 A | | 6/2021 | |

* cited by examiner

DISPLAY DEVICE AND METHOD OF PROVIDING THE SAME

BACKGROUND

This application claims priority to Korean Patent Application No. 10-2021-0154317 filed on Nov. 10, 2021, and all the benefits accruing therefrom under 35 U.S.C. § 119, which is hereby incorporated by reference for all purposes as if fully set forth herein.

1. Field

Embodiments relate to a display device capable of controlling a viewing angle and a method of manufacturing (or providing) the same.

2. Description of the Related Art

A display device may include a plurality of pixels emitting light. The display device may display an image by combining light emitted from each of the plurality of pixels. The display device may be frequently used in public places, and accordingly, there is a growing need for a display device displaying an image with a narrow viewing angle in order to protect personal information.

SUMMARY

Embodiments provide a display device capable of controlling a viewing angle.

Embodiments provide a method of manufacturing (or providing) the display device.

Additional features will be set forth in the description which follows, and in part will be apparent from the description, or may be learned by practice of the embodiments.

An embodiment of a display device includes a base substrate, a light emitting element layer on the base substrate and including a central non-emitting area, an emitting area surrounding the central non-emitting area, and a peripheral non-emitting area surrounding the emitting area, an encapsulation layer covering the light emitting element layer, and a light blocking layer on the encapsulation layer. The light blocking layer includes a first light blocking layer defining a first opening overlapping the emitting area, and a second light blocking layer which is in the first opening to have an island shape and spaced apart from the first light blocking layer.

In an embodiment, the second light blocking layer may overlap the central non-emitting area.

In an embodiment, the display device may further include a reflective layer between the encapsulation layer and the light blocking layer. The reflective layer may include a first reflective layer defining a second opening, and a second reflective layer in the second opening to have an island shape. The second opening may overlap the central non-emitting area and the emitting area. The second reflective layer may be spaced apart from the first reflective layer.

In an embodiment, the reflective layer may directly contact an upper surface of the encapsulation layer.

In an embodiment, each of a side surface of the first reflective layer and a side surface of the second reflective layer may be inclined with respect to the upper surface of the encapsulation layer.

In an embodiment, the first reflective layer may include a first organic layer on the encapsulation layer and a first metal layer which covers at least a side surface of the first organic layer, and the second reflective layer may include a second organic layer on the encapsulation layer and a second metal layer which covers at least a side surface of the second organic layer.

In an embodiment, the light emitting element layer may include a wide emitting area and a wide non-emitting area which surrounds the wide emitting area.

In an embodiment, an area of the wide emitting area may be substantially the same as an area of the emitting area.

In an embodiment, the display device may further include an organic covering layer covering the encapsulation layer, a touch sensing layer on the organic covering layer, and a color filter layer on the touch sensing layer.

In an embodiment, the light blocking layer may directly contact the color filter layer.

In an embodiment, the light emitting element layer may include a pixel electrode on the base substrate, a first pixel defining layer on the pixel electrode, defining a pixel opening exposing at least a portion of the pixel electrode and defining the peripheral non-emitting area, a second pixel defining layer on the pixel electrode in the pixel opening, spaced apart from the first pixel defining layer and defining the central non-emitting area, a light emitting layer on the pixel defining layer between the first pixel defining layer and the second pixel defining layer and defining the emitting area, and a common electrode on the light emitting layer.

An embodiment of a method of manufacturing (or providing) a display device may include forming (or providing) a light emitting element layer including a central non-emitting area, an emitting area surrounding the central non-emitting area, and a peripheral non-emitting area surrounding the emitting area, on a base substrate, forming an encapsulation layer covering the light emitting element layer, and forming a light blocking layer on the encapsulation layer. The light blocking layer may include a first light blocking layer defining a first opening overlapping the central non-emitting area and the emitting area, and a second light blocking layer in the first opening to have an island shape and spaced apart from the first light blocking layer.

In an embodiment, the method may further include forming an organic covering layer on the encapsulation layer, forming a touch sensing layer on the organic covering layer, and forming a color filter layer on the touch sensing layer.

In an embodiment, forming the light blocking layer may include applying an organic light blocking material, and removing a portion of the organic light blocking material overlapping the emitting area.

In an embodiment, the second light blocking layer may overlap the central non-emitting area.

In an embodiment, the method may further include forming a reflective layer including a first reflective layer and a second reflective layer, on the encapsulation layer. The first reflective layer may define a second opening, and the second reflective layer may be in the second opening to have an island shape and may be spaced apart from the first reflective layer. At least a portion of the second opening may overlap the central non-emitting area and the emitting area.

In an embodiment, the first reflective layer may include a first organic layer on the encapsulation layer and a first metal layer which covers at least a side surface of the first organic layer, and the second reflective layer may include a second organic layer on the encapsulation layer and a second metal layer which covers at least a side surface of the second organic layer.

In an embodiment, forming the light emitting element layer may include forming a pixel electrode on the base substrate, forming a pre-pixel defining layer covering the pixel electrode, on the base substrate, forming a first pixel defining layer and a second pixel defining layer which is spaced apart from the first pixel defining layer by removing a portion of the pre-pixel defining layer overlapping the emitting area, where the first pixel defining layer defines a pixel opening exposing at least a portion of the pixel defining layer and defines the peripheral non-emitting area, and the second pixel defining layer is in the pixel opening to have an island shape and defines the central non-emitting area, forming a light emitting layer on the pixel electrode, between the first pixel defining layer and the second pixel defining layer, and defining the emitting area, and forming a common electrode on the light emitting layer.

A display device according to one or more embodiment, may include a light emitting element layer including a central non-emitting area, an emitting area surrounding the central non-emitting area, and a peripheral non-emitting area surrounding the emitting area, and a light blocking layer including a first light blocking layer defining a first opening overlapping the emitting area and a second light blocking layer which is in the first opening to have an island shape. Accordingly, light emitted from the emitting area may have a relatively narrow viewing angle.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the embodiments.

DETAILED DESCRIPTION

Figure 1:
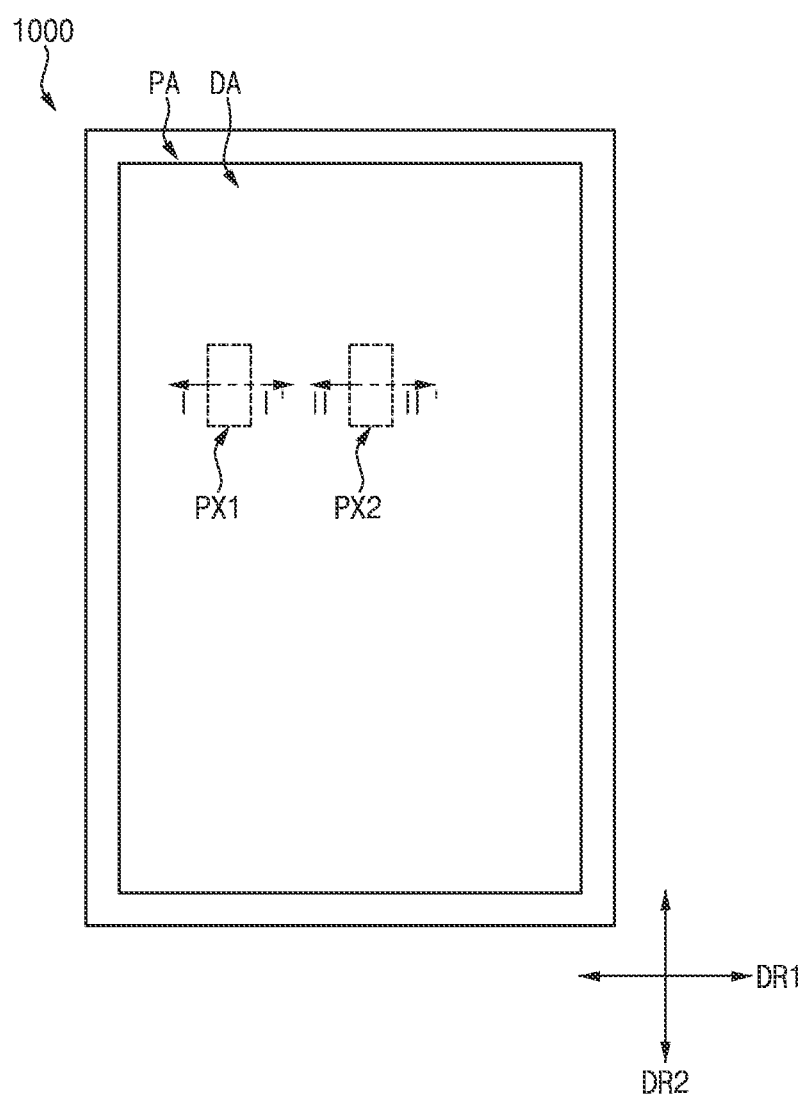
FIG. 1 is a plan view illustrating a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout. As used herein, a reference number may indicate a singular element or a plurality of the element. For example, a reference number labeling a singular form of an element within the drawing figures may be used to reference a plurality of the singular element within the text of specification.

It will be understood that when an element is referred to as being related to another element such as being "on" another element, it can be directly on the other element or intervening elements may be present therebetween. In contrast, when an element is referred to as being related to another element such as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The terms "below" or "beneath" can, therefore, encompass both an orientation of above and below.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Illustrative, non-limiting embodiments will be more clearly understood from the following detailed description in conjunction with the accompanying drawings.

FIG. 1 is a plan view illustrating a display device 1000 according to an embodiment.

Referring to FIG. 1, a display device 1000 may include a display area DA and a peripheral area PA.

The display area DA may be an area (e.g., a planar area) displaying an image. A pixel may be disposed in the display area DA. The pixel may be provided in plural as a plurality of pixels and include a first pixel PX1 and a second pixel PX2.

Light emitted from the first pixel PX1 may have a relatively narrow viewing angle. Light emitted from the second pixel PX2 may have a relatively wide viewing angle, that is, have a viewing angle wider than the first pixel PX1. In an embodiment, the display device 1000 may emit light only from the first pixel PX1. In other words, light may be emitted from the first pixel PX1 and light may not be emitted from the second pixel PX2. Accordingly, the display device 1000 may display an image with a relatively narrow viewing angle.

In an embodiment, the first pixel PX1 and the second pixel PX2 may be arranged in a matrix form within the display area DA. For example, the first pixel PX1 and the second pixel PX2 may be alternately arranged in (or along) a first direction DR1. At the same time, the first pixel PX1 and the second pixel PX2 may be alternately arranged in (or along) a second direction DR2 crossing, such as perpendicular, to the first direction DR1. A thickness direction of the display device 1000 may be taken along a third direction crossing each of the first direction DR1 and the second direction DR2. A view along the thickness direction may also define a "plan view" of a plane defined by the first direction DR1 and the second direction DR2 crossing each other.

The peripheral area PA may be adjacent to the display area DA, and may surround the display area DA. A driving part for driving the display device 1000 or pixels thereof, may be disposed in the peripheral area PA. In an embodiment, the peripheral area PA may be omitted, and the driver may be disposed in the display area DA. Various components or layers of the display device 1000 may include a display area DA and a peripheral area PA corresponding to those described above.

Figure 2:
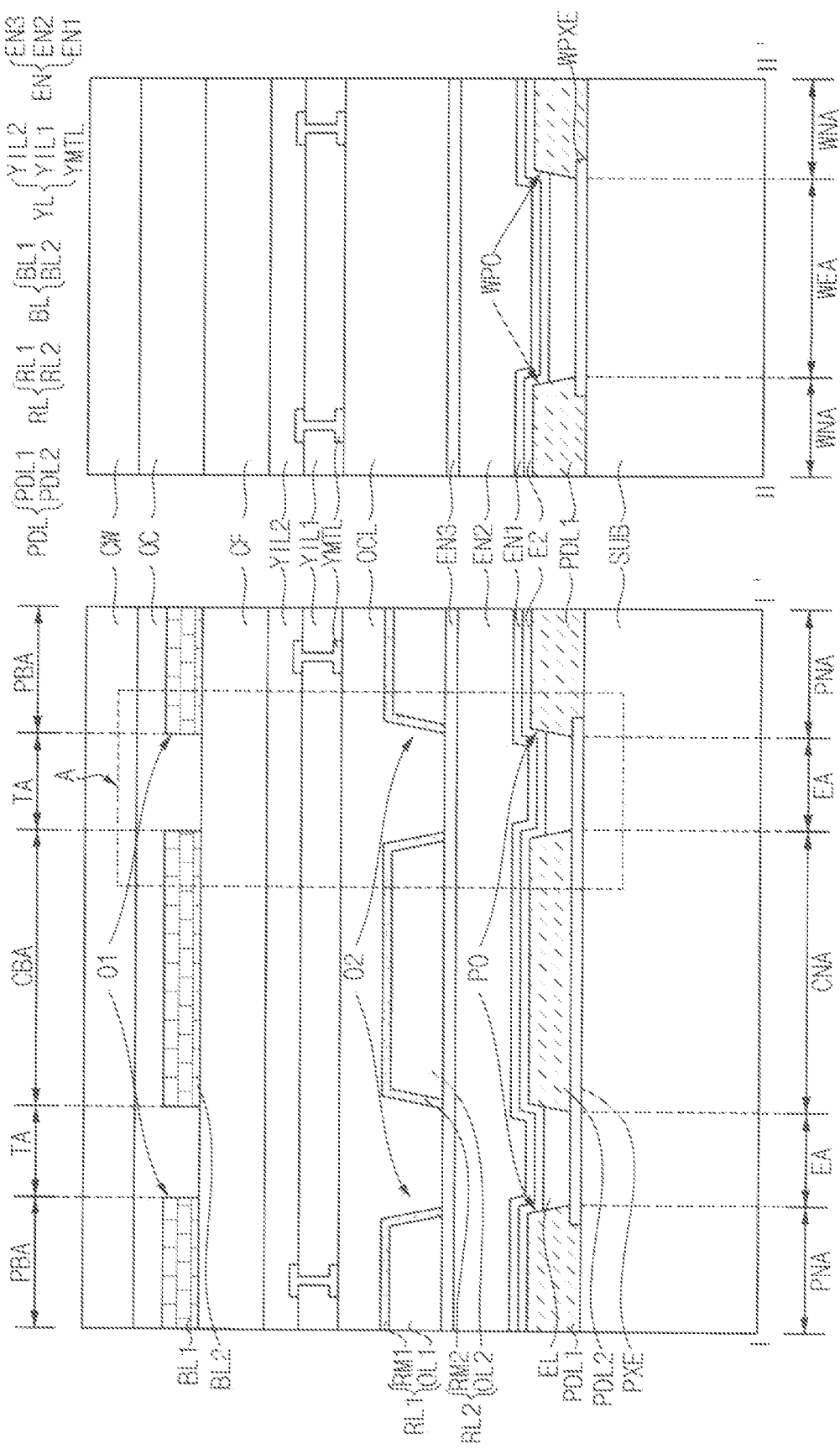
FIG. 2 is a cross-sectional view taken along lines and II-II' of FIG. 1.

FIG. 2 is a cross-sectional view taken along lines and II-I' of FIG. 1.

Referring to FIG. 2, the first pixel PX1 and the second pixel PX2 may include a base substrate SUB, pixel electrodes PXE and WPXE, a pixel defining layer PDL, a light emitting layer EL, a common electrode E2, an encapsulation layer EN, an organic covering layer OCL, a touch sensing layer YL, a color filter layer CF, a light blocking layer BL, an over coating layer OC, and a cover window CW.

The base substrate SUB may include one or more of an insulating layer and one or more of a conductive layer. The base substrate SUB may include at least one transistor and may be referred to as a transistor layer.

A light emitting element layer may be disposed on the base substrate SUB. The light emitting element layer may include a first light emitting element layer of first pixel PX1 and a second light emitting element layer of second pixel PX2. The first light emitting element layer may include the pixel electrode PXE, a first pixel defining layer PDL1 (e.g., a first pixel defining pattern), a second pixel defining layer PDL2 (e.g., a second pixel defining pattern), the light emitting layer EL, and the common electrode E2. The second light emitting element layer may include a wide-pixel electrode WPXE, the first pixel defining layer PDL1, the light emitting layer EL, and the common electrode E2.

The pixel electrode PXE and the wide-pixel electrode WPXE may be disposed on the base substrate SUB. Each of the pixel electrode PXE and the wide-pixel electrode WPXE may be electrically connected to the transistor, that is, to the transistor layer of the base substrate SUB. Each of the pixel electrode PXE and the wide-pixel electrode WPXE may be an anode electrode. In an embodiment, an area (e.g., a planar area) of the pixel electrode PXE may be larger than an area of the wide-pixel electrode WPXE, in a plan view. Each of the pixel electrode PXE and the wide-pixel electrode WPXE may include a conductive material. In an embodiment, each of the pixel electrode PXE and the wide-pixel electrode WPXE may include titanium and aluminum.

The first pixel defining layer PDL1 may be disposed on the pixel electrode PXE and the wide-pixel electrode WPXE. In the first pixel PX1, the first pixel defining layer PDL1 may have (or define) a pixel opening PO exposing at least a portion of the pixel electrode PXE (e.g., exposing to outside the pixel defining layer PDL). In the second pixel PX2, the first pixel defining layer PDL1 may have a wide-pixel opening WPO exposing at least a portion of the wide-pixel electrode WPXE. The first pixel defining layer PDL1 may include an organic material.

The second pixel defining layer PDL2 may be disposed on the pixel electrode PXE and in the pixel opening PO to have an island shape (or pattern). The second pixel defining layer PDL2 may be spaced apart from the first pixel defining layer PDL1, in a direction along the pixel electrode PXE. The second pixel defining layer PDL2 may include an organic material.

In the first pixel PX1, an area in which the first pixel defining layer PDL1 is disposed may define a peripheral non-emitting area PNA in which light is not emitted. In the first pixel PX1, an area in which the second pixel defining layer PDL2 is disposed may define a central non-emitting area CNA in which light is not emitted. In the second pixel PX2, an area in which the first pixel defining layer PDL1 is disposed may define a wide non-emitting area WNA in which light is not emitted. The peripheral non-emitting area PNA and the central non-emitting area CNA of the first pixel PX1 may together define a non-emitting area. In an embodiment, the first pixel PX1 which has the viewing angle narrower than the viewing angle of the second pixel PX2 includes the light blocking layer BL (together with the pixel defining layer PDL or alone) which faces the light emitting element layer and defines the non-emitting area of the light emitting element layer, and portions of the non-emitting area alternating with portions of the light emitting layer EL, in a direction along the light emitting element layer.

The light emitting layer EL may be disposed on the pixel electrodes PXE and WPXE. Specifically, in the first pixel PX1, the light emitting layer EL may be disposed on the pixel electrode PXE, between the first pixel defining layer PDL1 and the second pixel defining layer PDL2. In the second pixel PX2, the light emitting layer EL may be disposed on the wide-pixel electrode WPXE, in the wide-pixel opening WPO.

In the first pixel PX1, an area in which the light emitting layer EL is disposed may define an emitting area EA (e.g., a light emitting area) in which light is emitted (e.g., a first light emitting area). In the second pixel PX2, an area in which the light emitting layer EL is disposed may define a wide emitting area WEA in which light is emitted (e.g., a second light emitting area having a planar area larger than a planar area of the first light emitting area).

The common electrode E2 may be disposed on the light emitting layer EL. Specifically, in the first pixel PX1, the common electrode E2 may cover the light emitting layer EL, the first pixel defining layer PDL1, and the second pixel defining layer PDL2. In the second pixel PX2, the common electrode E2 may cover the light emitting layer EL and the first pixel defining layer PDL1. The common electrode E2 may include a transparent conductive material. In an embodiment, the common electrode E2 may include ITO (indium tin oxide). The common electrode E2 may be a cathode electrode.

The encapsulation layer EN may cover the first light emitting element layer and the second light emitting element layer. The encapsulation layer EN may protect the first light emitting element layer and the second light emitting element layer from impurities such as moisture and gas. The encapsulation layer EN may include a first inorganic encapsulation layer EN1, an organic encapsulation layer EN2, and a second inorganic encapsulation layer EN3.

The first inorganic encapsulation layer EN1 may include an inorganic insulating material. The first inorganic encapsulation layer EN1 may cover the common electrode E2. The organic encapsulation layer EN2 may include an organic insulating material. The organic encapsulation layer EN2 may cover the first inorganic encapsulation layer EN1. The second inorganic encapsulation layer EN3 may include an inorganic insulating material. The second inorganic encapsulation layer EN3 may cover the organic encapsulation layer EN2.

In the first pixel PX1, a reflective layer RL may be disposed on the encapsulation layer EN. The reflective layer RL may include a first reflective layer RL1 (e.g., first reflective pattern) and the second reflective layer RL2 (e.g., a second reflective pattern).

The first reflective layer RL1 may have (or define) a second opening O2. At least a portion of the second opening O2 may overlap the central non-emitting area CNA and the emitting area EA. The second reflective layer RL2 may be spaced apart from the first reflective layer RL1 in the second opening O2 to have an island shape.

In an embodiment, the first reflective layer RL1 may include a first organic layer OL1 including a plurality of first organic patterns disposed on the encapsulation layer EN and a first metal layer RM1 including a plurality of first metal patterns which covers the first organic layer OL1, and the second reflective layer RL2 may include a second organic layer OL2 including a plurality of second organic patterns disposed on the encapsulation layer EN and a second metal layer RM2 including a plurality of second metal patterns which covers the second organic layer OL2. Each of the first metal layer RM1 and the second metal layer RM2 may include a material, such as a metal, having a relatively high (light) reflectance.

In an embodiment, the reflective layer RL may directly contact an upper surface of the encapsulation layer EN which is furthest from the base substrate SUB. As being in contact, elements may form an interface therebetween. For example, the reflective layer RL may directly contact an upper surface of the second inorganic encapsulation layer EN3. Each of the reflective layer RL1 and the second reflective layer RL2 may have an upper surface furthest from the base substrate SUB, and a side surface which extends from the upper surface and toward the base substrate SUB. In this case, each of a side surface of the first reflective layer RL1 and a side surface of the second reflective layer RL2 may be inclined with respect to the upper surface of the encapsulation layer EN.

The organic covering layer OCL may be disposed on the encapsulation layer EN. In the first pixel PX1, the organic covering layer OCL may cover the reflective layer RL. The organic covering layer OCL may include an organic insulating material. An upper surface of the organic covering layer OCL which is furthest from the base substrate SUB, may be substantially flat.

The touch sensing layer YL may be disposed on the organic covering layer OCL. The touch sensing layer YL may sense an external input which is applied to the display device 1000. The external input may be contact (e.g., a touch), pressure, light, proximity, etc. from an input tool (e.g., a body part of a user, pen, etc.).

In an embodiment, the touch sensing layer YL may include a first touch insulating layer YIL1, a touch electrode YMTL, and a second touch insulating layer YIL2 facing the first touch insulating layer YIL1 with the touch electrode YMTL therebetween. The first touch insulating layer YIL1 may include an insulating material. The second touch insulating layer YIL2 may include an insulating material, and may be disposed on the first touch insulating layer YIL1 to be further from the base substrate SUB than the first touch insulating layer YIL1. The touch electrode YMTL may include a first touch electrode disposed on the organic covering layer OCL and a second touch electrode which is disposed on the first touch insulating layer YIL1 and contacting the first touch electrode through a through hole formed in (or provided in) the first touch insulating layer YIL1.

The color filter layer CF may be disposed on the touch sensing layer YL. The color filter layer CF may block light having a wavelength different from a wavelength of light emitted from the light emitting layer EL. For example, when the light emitting layer EL emits light having a first wavelength, the color filter layer CF may transmit light having the first wavelength and may block light having a wavelength different from the first wavelength.

In the first pixel PX1, the light blocking layer BL may be disposed on the color filter layer CF. The light blocking layer BL may directly contact an upper surface of the color filter layer CF. The light blocking layer BL may block light. The light blocking layer BL may include a plurality of light blocking patterns including a first light blocking layer BL1 (e.g., a first light blocking pattern) and a second light blocking layer BL2 (e.g., a second light blocking pattern).

The first light blocking layer BL1 may have (or define) a first opening O1. The first opening O1 may overlap (or correspond to) both the central non-emitting area CNA and the emitting area EA. The second light blocking layer BL2 may be disposed in the first opening O1 to have an island shape. The second light blocking layer BL2 may be spaced apart from the first light blocking layer BL1 in a direction along the first light emitting element layer. In an embodiment, the second light blocking layer BL2 may overlap the central non-emitting area CNA.

An area in which the first light blocking layer BL1 is disposed may define a peripheral light blocking area PBA in which light is blocked. An area in which the second light blocking layer BL2 is disposed may define central light blocking area CBA in which light is blocked. An area between the first light blocking layer BL1 and the second light blocking layer BL2 may define a transmission area TA through which light is transmitted.

The over coating layer OC may be disposed on the color filter layer CF. The over coating layer OC may include an insulating material. In the first pixel PX1, the over coating layer OC may cover the light blocking layer BL.

The cover window CW may be disposed on the over coating layer OC. The cover window CW may include a material having a relatively large rigidity. For example, the cover window CW may include glass, plastic, etc.

Figure 3:
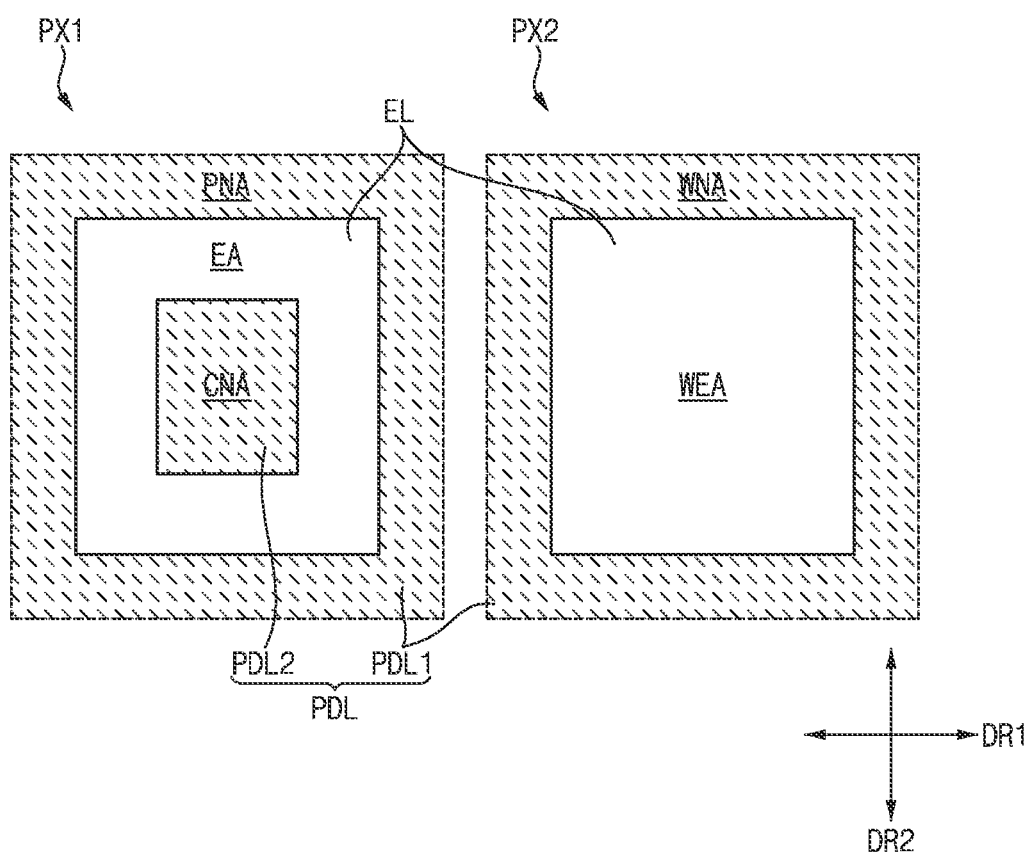
FIG. 3, FIG. 4, and FIG. 5 are plan view illustrating a first pixel and a second pixel included in the display device of FIG. 1.
Figure 4:
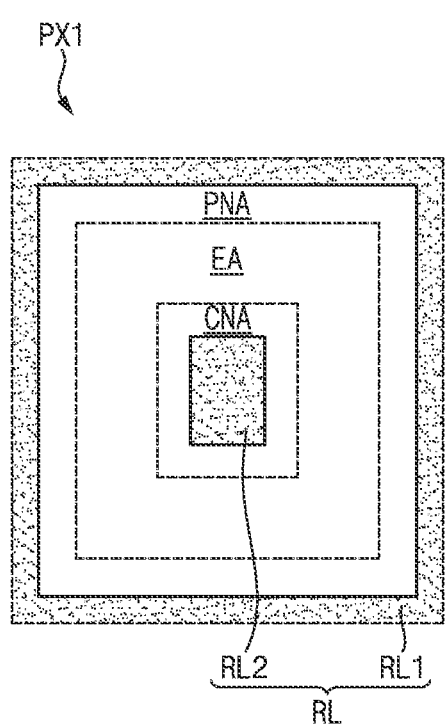
Figure 5:
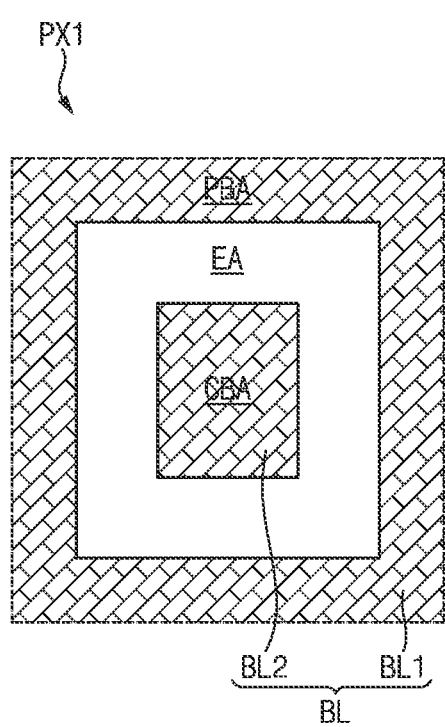

FIG. 3, FIG. 4, and FIG. 5 are plan views illustrating a first pixel PX1 and a second pixel PX2 included in the display device 1000 of FIG. 1.

Referring to FIG. 3, the first pixel PX1 may include the central non-emitting area CNA, the emitting area EA, and the peripheral non-emitting area PNA, and the second pixel PX2 may include the wide emitting area WEA and wide non-emitting area WNA.

The central non-emitting area CNA may be an area in which the second pixel defining layer PDL2 is disposed in the first pixel PX1.

The emitting area EA may be an area in which the light emitting layer EL is disposed in the first pixel PX1. The emitting area EA may surround the central non-emitting area CNA.

The peripheral non-emitting area PNA may be an area in which the first pixel defining layer PDL1 is disposed in the first pixel PX1. The peripheral non-emitting area PNA may surround the emitting area EA.

The wide emitting area WEA may be an area in which the light emitting layer EL is disposed in the second pixel PX2.

The wide non-emitting area WNA may be an area in which the first pixel defining layer PDL1 is disposed in the second pixel PX2. The wide non-emitting area WNA may surround the wide emitting area WEA.

In an embodiment, an area (e.g., a total planar area) of the emitting area EA may be substantially same as an area (e.g., a total planar area) of the wide emitting area WEA. Referring to FIG. 2, for example, a width of the wide-pixel opening WPO in a direction along the base substrate SUB, may be greater than a width of a portion of the pixel opening PO at a respective portion of the emitting area EA. As represented by the relative widths along the base substrate SUB in FIG. 2, an area of the wide emitting area WEA at the wide-pixel opening WPO may be substantially the same as a total area of the emitting area EA (where FIG. 2 shows two portions of the emitting area EA along the base substrate SUB).

Accordingly, an amount of light emitted from the first pixel PX1 may be substantially same as amount of light emitted from the second pixel PX2.

In an embodiment, the central non-emitting area CNA, the emitting area EA, and the peripheral non-emitting area PNA may be symmetrical with respect to the first direction DR1 and the second direction DR2 in a plan view.

Figure 14:
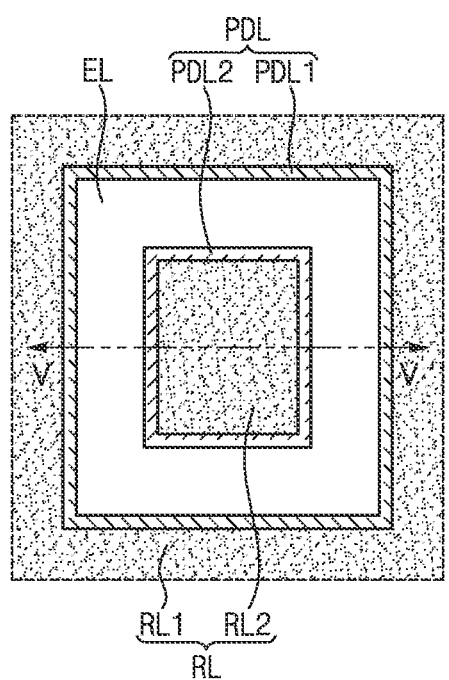
Figure 15:
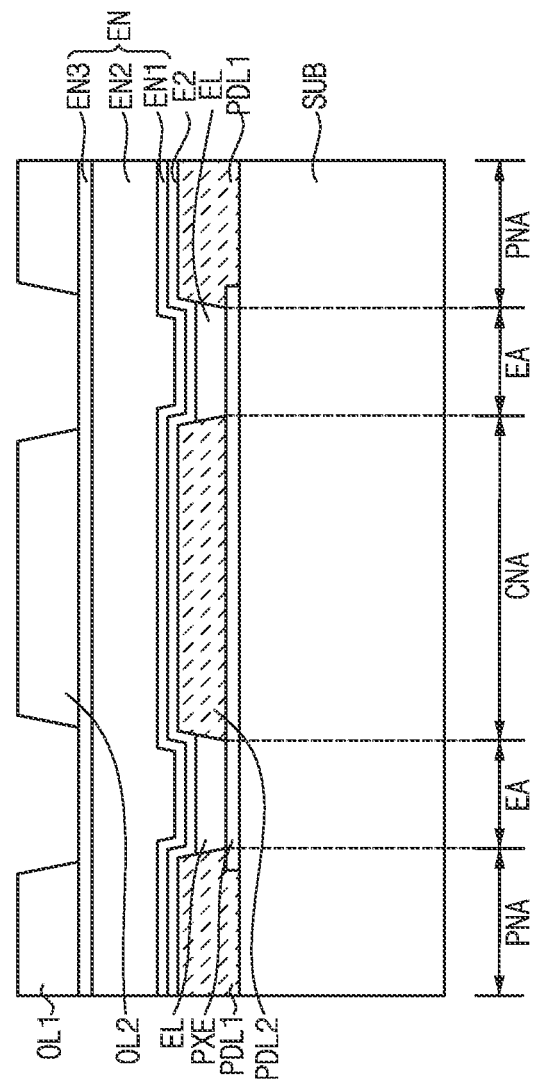
Figure 16:
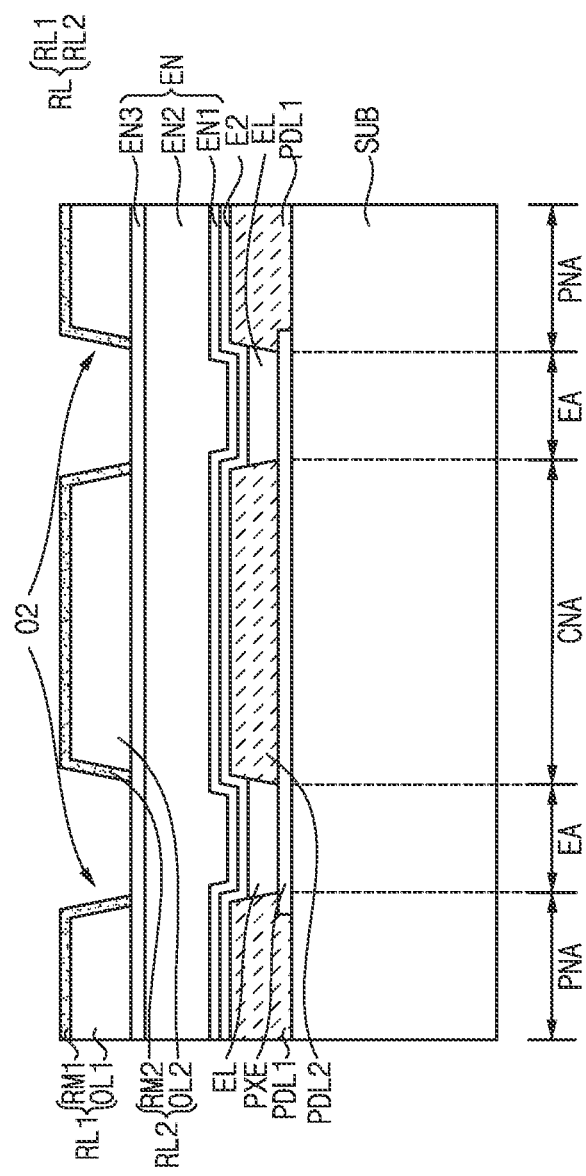
Figure 17:
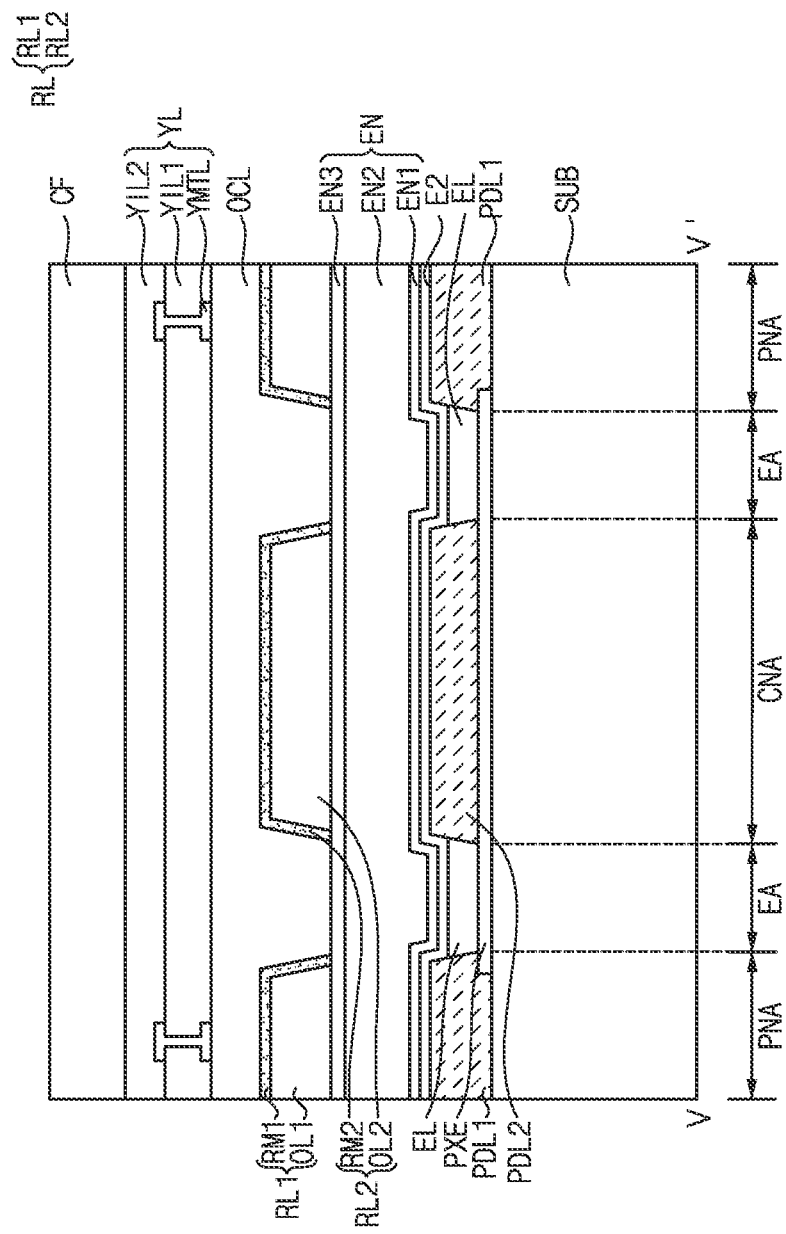

Referring to FIG. 4, in the first pixel PX1, the first reflective layer RL1 may overlap a portion of the peripheral non-emitting area PNA, and may not overlap the emitting area EA and the central non-emitting area CNA. In addition, in the first pixel PX1, the second reflective layer RL2 may overlap a portion of the central non-emitting area CNA, and may not overlap a boundary between the central non-emitting area CNA and the emitting area EA. That is, in the first pixel PX1, a portion of the first pixel defining layer PDL1 at the peripheral non-emitting area PNA and a portion of the second pixel defining layer PDL2 at the central non-emitting area CNA may be exposed outside of the reflective layer RL, to define an exposed portion of the pixel defining layer PDL. Referring to FIGS. 4 and 14, the exposed portions of the pixel defining layer PDL may be portions closest to the emitting area EA.

However, arrangement of the first reflective layer RL1 and arrangement of the second reflective layer RL2 may be variously modified. In an embodiment, the first reflective layer RL1 may overlap the peripheral non-emitting area PNA, such as an entirety of the peripheral non-emitting area PNA. In an embodiment, the second reflective layer RL2 may overlap the central non-emitting area CNA, such as an entirety of the central non-emitting area CNA. In an embodiment, the second reflective layer RL2 may overlap the central non-emitting area CNA and extend from the central non-emitting area CNA and into a portion of the emitting area EA.

Referring to FIG. 5, in the first pixel PX1, the second light blocking layer BL2 may overlap the central non-emitting area CNA. In other words, the central light blocking area CBA may overlap the central light non-emitting area CNA.

In the first pixel PX1, the first light blocking layer BL1 may overlap the peripheral non-emitting area PNA, such as an entirety of the peripheral non-emitting area PNA. In other words, the peripheral light blocking area PBA may overlap the peripheral non-emitting area PNA. Accordingly, the peripheral light blocking area PBA may surround the central light blocking area CBA and may be spaced apart from the central light blocking area CBA in the plan view, and the transmission area TA disposed between the peripheral light blocking area PBA and the central light blocking area CBA may overlap the emitting area EA.

However, arrangement of the first light blocking layer BL1 and arrangement of the second light blocking layer BL2 may be variously modified. In an embodiment, the first light blocking layer BL1 may overlap the peripheral non-emitting area PNA and a portion of the emitting area EA. In an embodiment, the first light blocking layer BL1 may overlap a portion of the peripheral non-emitting area PNA. In an embodiment, the second light blocking layer BL2 may overlap a portion of the central non-emitting area CNA.

Figure 6:
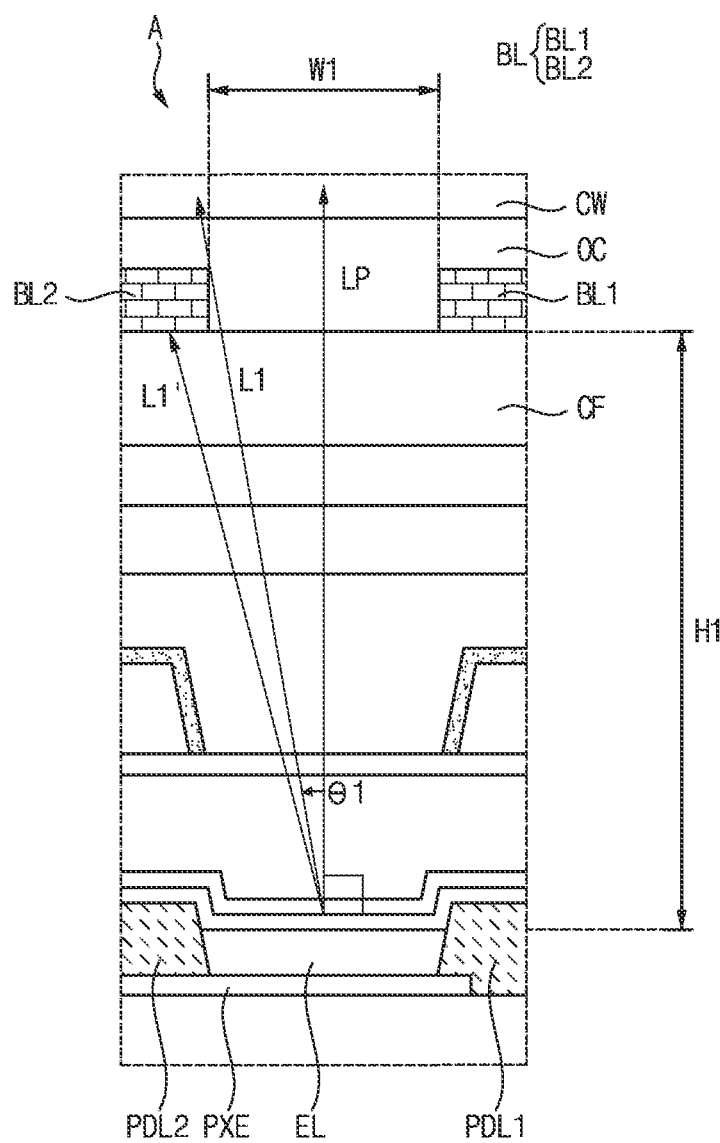
FIG. 6 and FIG. 7 are enlarged views of area A of FIG. 2.
Figure 7:
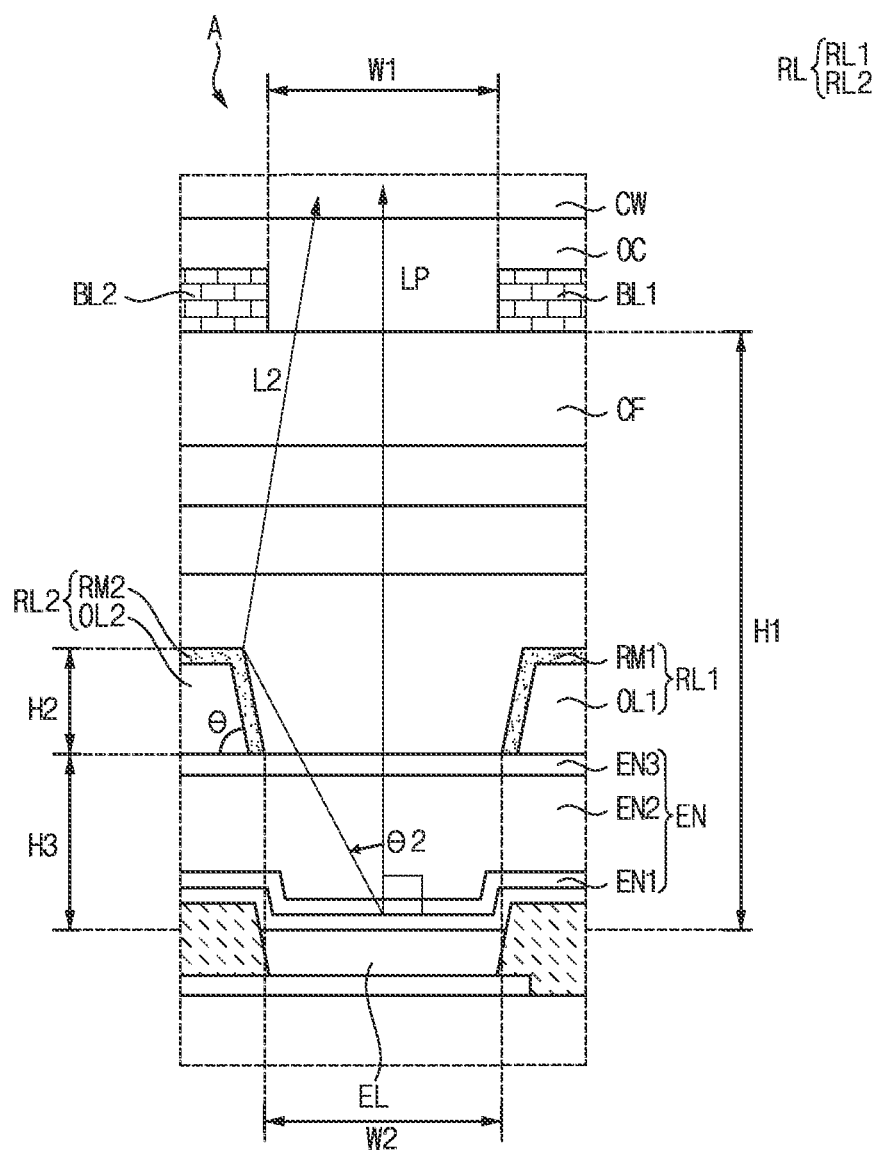

FIG. 6 and FIG. 7 are enlarged cross-sectional views of area A of FIG. 2.

Referring to FIG. 6, the light emitting layer EL may emit light. Light emitted from the light emitting layer EL may be emitted at various angles with respect to an upper surface of the light emitting layer EL which is furthest from the base substrate SUB (or closest to the encapsulation layer EN).

The light blocking layer BL may block a portion of light emitted from the light emitting layer EL. Specifically, light LP emitted perpendicularly to the upper surface of the light emitting layer EL may be recognized from outside the display device 1000. Light L1 emitted to be inclined by a first angle θ1 relative to a direction in which the light LP travels (e.g., a first angle light) may also be recognized from outside the display device 1000. However, light L1' emitted to be inclined by an angle greater than the first angle θ1 relative to the direction in which the light LP travels (e.g., a second angle light having an angle greater than an angle of the first angle light) may be blocked by the second light blocking layer BL2. Accordingly, the light L1' may not be recognized from outside the display device 1000, to narrow a viewing angle at the first pixel PX1.

An amount of light blocked by the light blocking layer BL, among emitting light from the light emitting layer EL, may be determined by a first separation distance W1 between the first light blocking layer BL1 and the second light blocking layer BL2 in a direction along the first light emitting element layer, a distance H1 (e.g., a first distance) from the upper surface of the light emitting layer EL to a lower surface of the light blocking layer BL which is closest to the base substrate SUB.

In the present invention, a portion of light emitted in a direction inclined with respect to the upper surface of the light emitting layer EL may be blocked by the light blocking layer BL. Accordingly, light emitted from the first pixel PX1 may have a relatively narrow viewing angle.

Referring to FIG. 7, in a same one of the first pixel PX1, a portion of light emitted to be inclined with respect to the upper surface of the light emitting layer EL may be reflected from a side surface of the reflective layer RL and may travel between the first light blocking layer BL1 and the second light blocking layer BL2 (e.g., through a gap at the first separation distance W1), and may be recognized from outside the display device 1000.

For example, light L2 emitted to be inclined by a second angle θ2 relative to the direction in which the light LP travels may be reflected from a side surface of the second reflective layer RL2 and may travel between the first light blocking layer BL1 and the second light blocking layer BL2. In this case, the second angle θ2 may be greater than the first angle θ1. Accordingly, the light L2 (e.g., a third angle light having an angle greater than an angle of the second angle light) may be recognized from outside the display device 1000.

An amount and a viewing angle of light reflected from the reflective layer RL and recognized from outside the display device 1000 may be determined by the first separation distance W1 between the first light blocking layer BL1 and the second light blocking layer BL2, a second separation distance W2 between the first reflective layer RL1 and the second reflective layer RL2, the distance H1 from the upper surface of the light emitting layer EL to the lower surface of the light blocking layer BL, a height H2 of the reflective layer RL between upper and lower surfaces thereof, a distance H3 (e.g., a second distance) between the upper surface of the light emitting layer EL and a lower surface of the reflective layer RL.

In the present invention, the reflective layer RL may reflect a portion of light emitted from the light emitting layer EL to condense the light. Accordingly, the reflective layer RL may minimize loss of light emitted from the first pixel PX1, and may focus light emitted from the first pixel PX1 to be emitted at a relatively narrow viewing angle. That is, the condensed light from the reflective layer RL which is transmitted through the light blocking layer BL, together with the emitted and first angle lights from the light emitting layer EL which are transmitted light through the light blocking layer BL, define a total amount of light emitting at the first pixel PX1 having the viewing angle which is narrower than the viewing angle of light emitting at the second pixel PX2.

Figure 8:
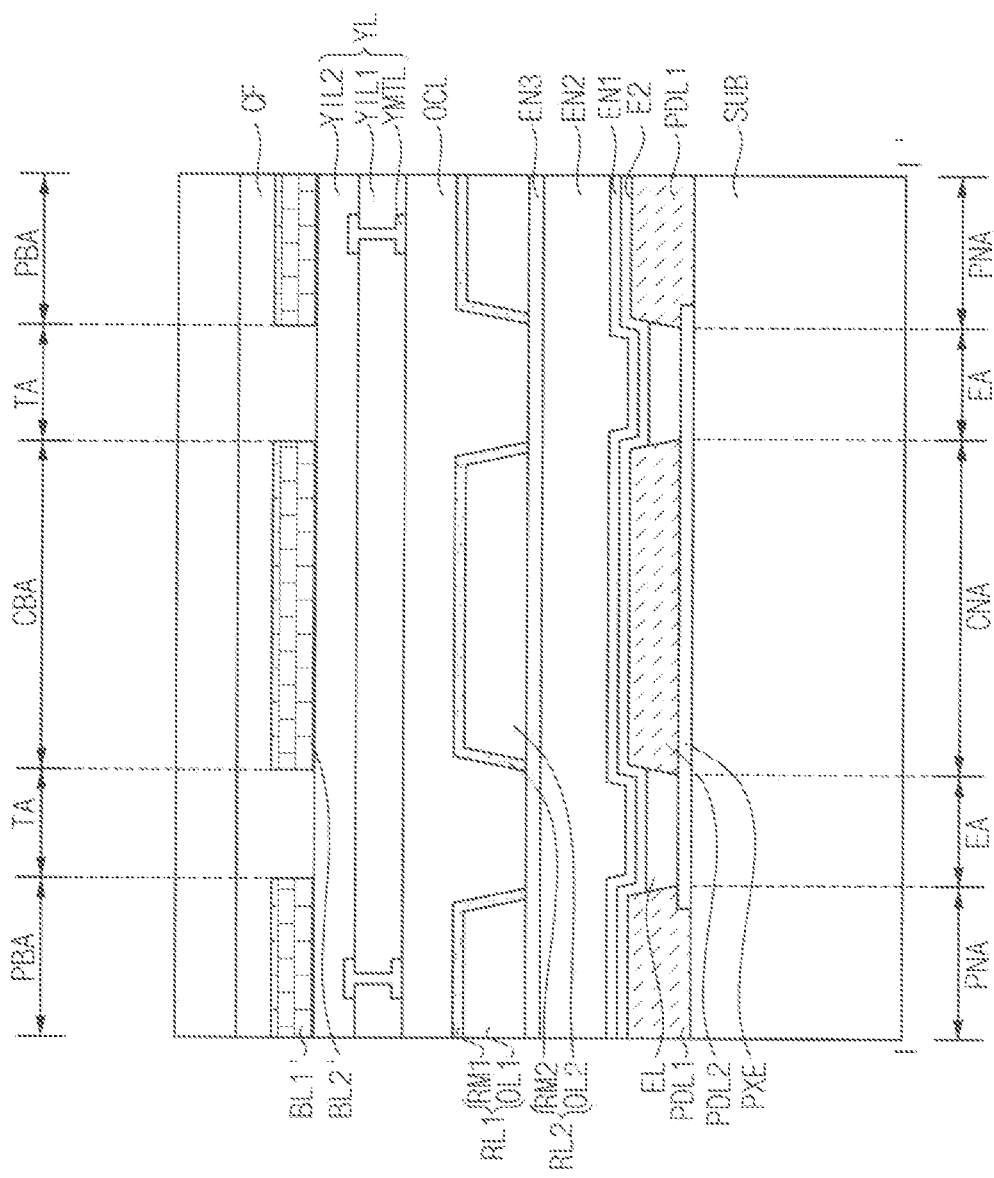
FIG. 8 is a cross-sectional view illustrating a first pixel according to an embodiment.

FIG. 8 is a cross-sectional view illustrating a first pixel PX1 according to an embodiment. Description of configuration substantially same as the configuration described with reference to FIG. 1, FIG. 2, FIG. 3, FIG. 4, FIG. 5, FIG. 6, and FIG. 7 may be omitted. The uppermost layer shown in FIG. 8 may be an over coating layer OC and/or a cover window CW, without being limited thereto.

Referring to FIG. 8, a first light blocking layer BL1' and the second light blocking layer BL2' may be disposed on the touch sensing layer YL. In addition, a color filter layer CF may cover the first light blocking layer BL1' and the second light blocking layer BL2'. In this case, a distance (like H1 in FIG. 7) between a light emitting layer EL and a lower surface of the first light blocking layer BL1' and a distance (like H1 in FIG. 7) between the light emitting layer EL and a lower surface of the second light blocking layer BL2' may be relatively small.

Figure 9:
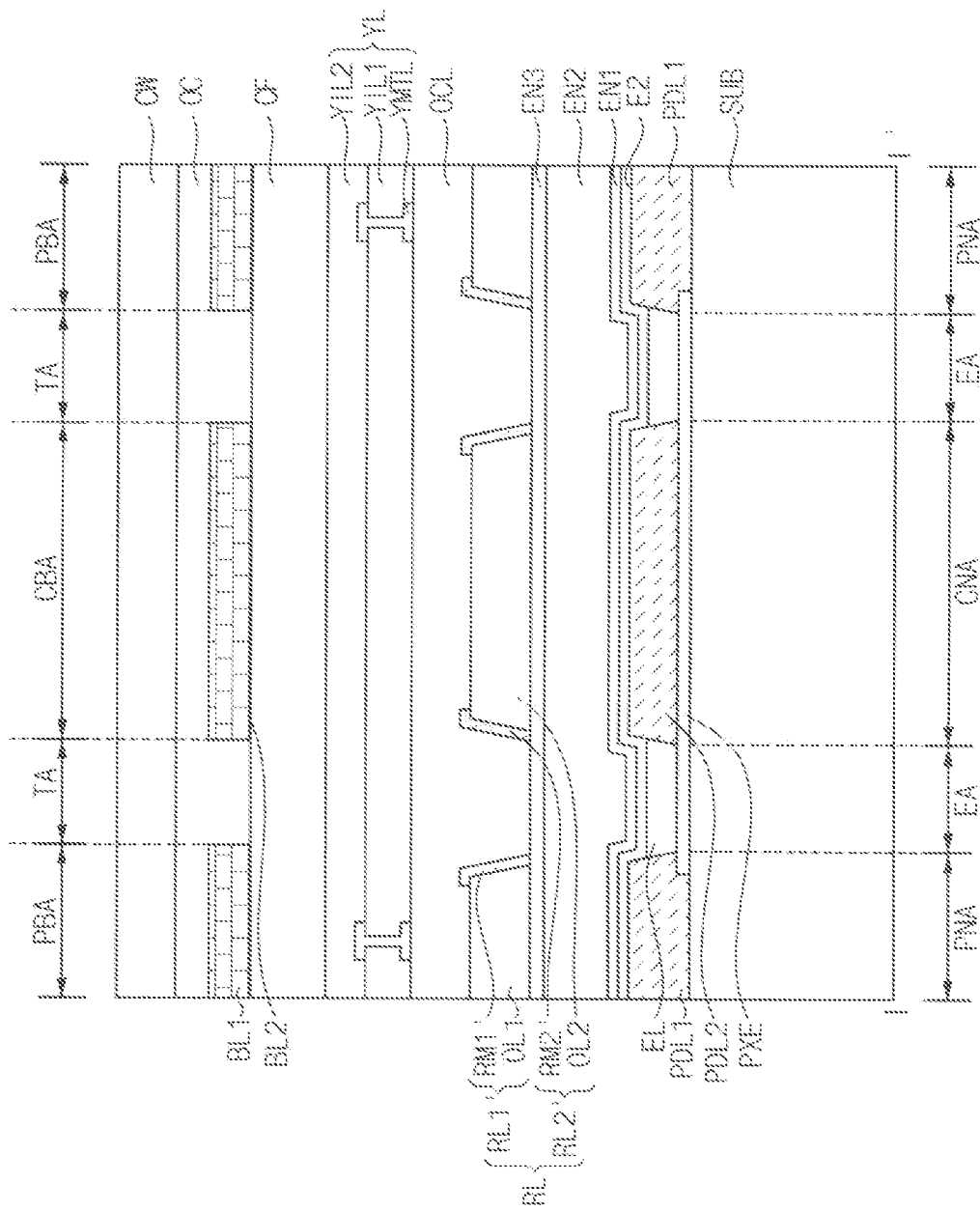
FIG. 9 is a cross-sectional view illustrating a first pixel according to an embodiment.

FIG. 9 is a cross-sectional view illustrating a first pixel PX1 according to an embodiment. Description of configuration substantially same as the configuration described with reference to FIG. 1, FIG. 2, FIG. 3, FIG. 4, FIG. 5, FIG. 6, and FIG. 7 may be omitted.

Referring to FIG. 9, a first metal layer RM1' may cover only a side surface of a first organic layer OL1, and a second metal layer RM2' may cover only a side surface of a second organic layer OL2. An upper surface of the first organic layer OL1 and the second organic layer OL2 may be exposed outside of the respective metal layers. In this case, an upper surface of a first reflective layer RL1' and an upper surface of a second reflective layer RL2' may have a relatively low reflectivity, and a side surface of the first reflective layer RL1' and a side surface of the second reflective layer RL2' may have a relatively high reflectivity. Accordingly, external light incident from an outside of the display device 1000 may not be reflected by the upper surface of the reflective layer RL, and the external light may not be recognized from outside the display device 1000.

FIG. 10, FIG. 11, FIG. 12, FIG. 13, FIG. 14, FIG. 15, FIG. 16, FIG. 17, FIG. 18, and FIG. 19 are diagrams illustrating a method of manufacturing (or providing) a display device 1000 according to an embodiment.

Figure 10:
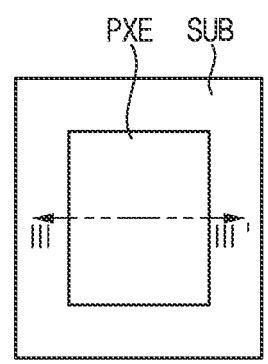
FIG. 10, FIG. 11, FIG. 12, FIG. 13, FIG. 14, FIG. 15, FIG. 16, FIG. 17, FIG. 18, and FIG. 19 are diagrams illustrating a method of manufacturing (or providing) a display device according to an embodiment.
Figure 11:
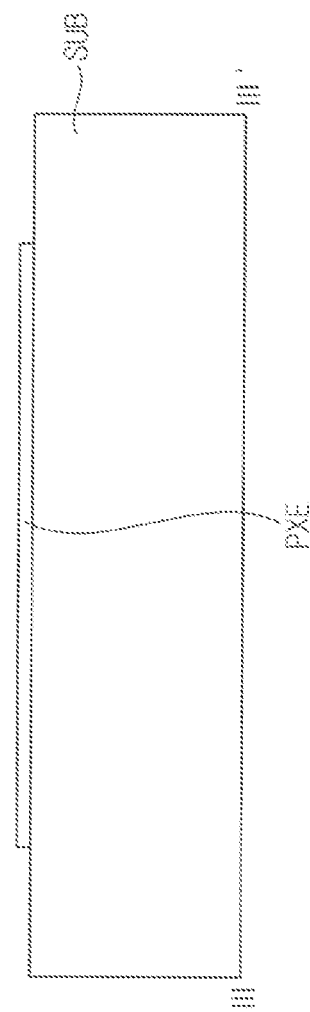

Referring to FIG. 10 and FIG. 11, a pixel electrode PXE may be formed on the base substrate SUB.

Figure 12:
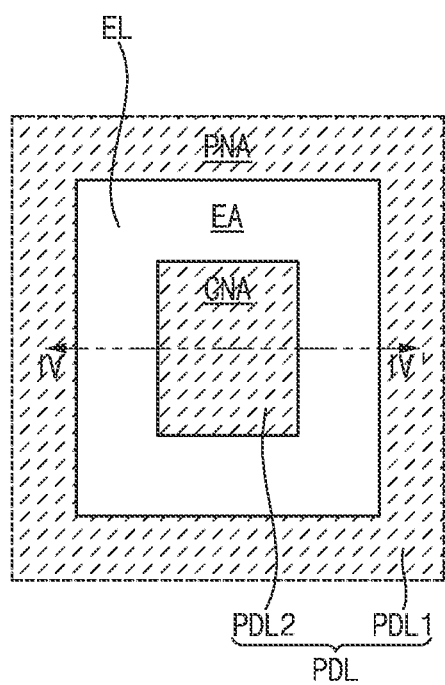
Figure 13:
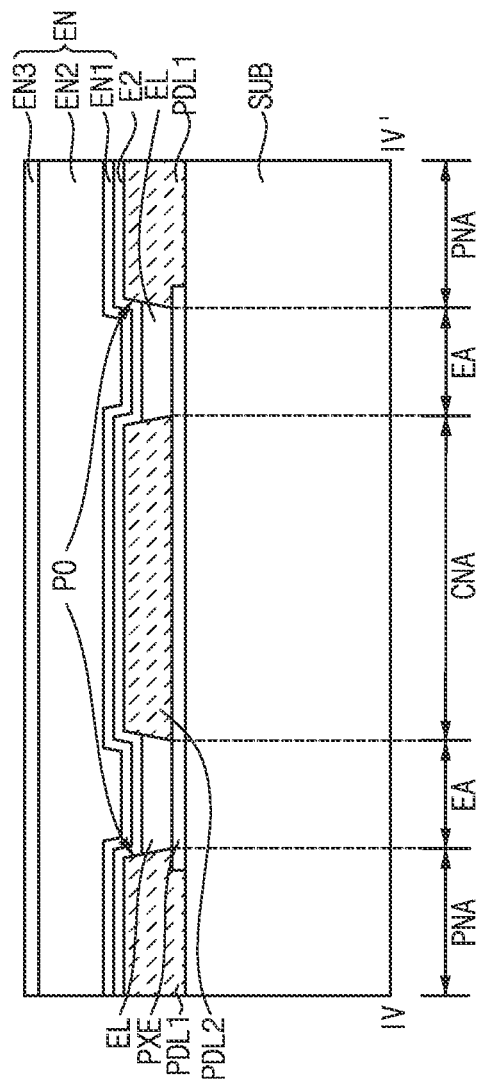

Referring to FIG. 12 and FIG. 13, a first pixel defining layer PDL1 and a second pixel defining layer PDL2 may be formed (or provided) on the base substrate SUB. Forming the first pixel defining layer PDL1 and the second pixel defining layer PDL2 may include forming a pre-pixel defining layer covering the pixel electrode PXE, on the base substrate SUB, and removing a portion of the pre-pixel defining layer overlapping an emitting area EA. In this case, the first pixel defining layer PDL1 may have (or define) a pixel opening PO exposing at least a portion of the pixel electrode PXE to outside the pixel defining layer PDL. In addition, the second pixel defining layer PDL2 may be disposed in the pixel opening PO to have an island shape, and may be spaced apart from the first pixel defining layer PDL1. An area in which the first pixel defining layer PDL1 is disposed may be defined as a peripheral non-emitting area PNA, and an area in which the second pixel defining layer PDL2 is disposed may be defined as an central non-emitting area CNA.

After forming the first pixel defining layer PDL1 and the second pixel defining layer PDL2, a light emitting layer EL may be formed on the pixel electrode PXE. The light emitting layer EL may be disposed between the first pixel defining layer PDL1 and the second pixel defining layer PDL2. The light emitting layer EL may define an emitting area EA.

After forming the light emitting layer EL, a common electrode E2 may be formed to cover the light emitting layer EL, the first pixel defining layer PDL1, and the second pixel defining layer PDL2. An encapsulation layer EN including a first inorganic encapsulation layer EN1, an organic encapsulation layer EN2, and a second inorganic encapsulation layer EN3 may be formed on the common electrode E2.

Referring to FIG. 14, FIG. 15, FIG. 16, and FIG. 17, a reflective layer RL may be formed on the encapsulation layer EN. The reflective layer RL may include a first reflective layer RL1 and a second reflective layer RL2. The first reflective layer RL1 may have (or define) a second opening O2. In this case, at least a portion of the second opening O2 may overlap the central non-emitting area CNA and the emitting area EA. The second reflective layer RL2 may be disposed in the second opening O2 to have an island shape. The second reflective layer RL2 may be spaced apart from the first reflective layer RL1. The first reflective layer RL1 may include a first organic layer OL1 together with a first metal layer RM1, and the second reflective layer RL2 may include a second organic layer OL2 together with a second metal layer RM2.

The first reflective layer RL1 and the second reflective layer RL2 may be integrally formed. Specifically, forming the first reflective layer RL1 and the second reflective layer RL2 may include applying an organic material on the encapsulation layer EN, etching a portion of the organic material to form the first organic layer OL1 and the second organic layer OL2, applying a metal covering the first organic layer OL1, the second organic layer OL2 and the encapsulation layer EN, etching the metal to form the first metal layer RM1 covering the first organic layer OL1 and the second metal layer RM2 covering the second organic layer OL2 (refer to FIGS. 3 and 8, for example). In this case, an etching amount of the metal may be adjusted so that the first metal layer RM1 covers only a side surface of the first organic layer OL1 and the second metal layer RM2 covers only a side surface of the second organic layer OL2 (refer to FIG. 9, for example).

After forming the reflective layer RL, an organic covering layer OCL covering the reflective layer RL, a touch sensing layer YL disposed on the organic covering layer OCL, and the color filter layer CF disposed on the touch sensing layer YL may be formed.

Figure 18:
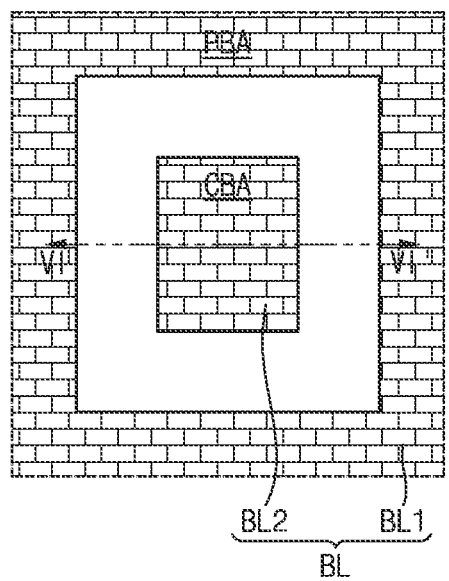
Figure 19:
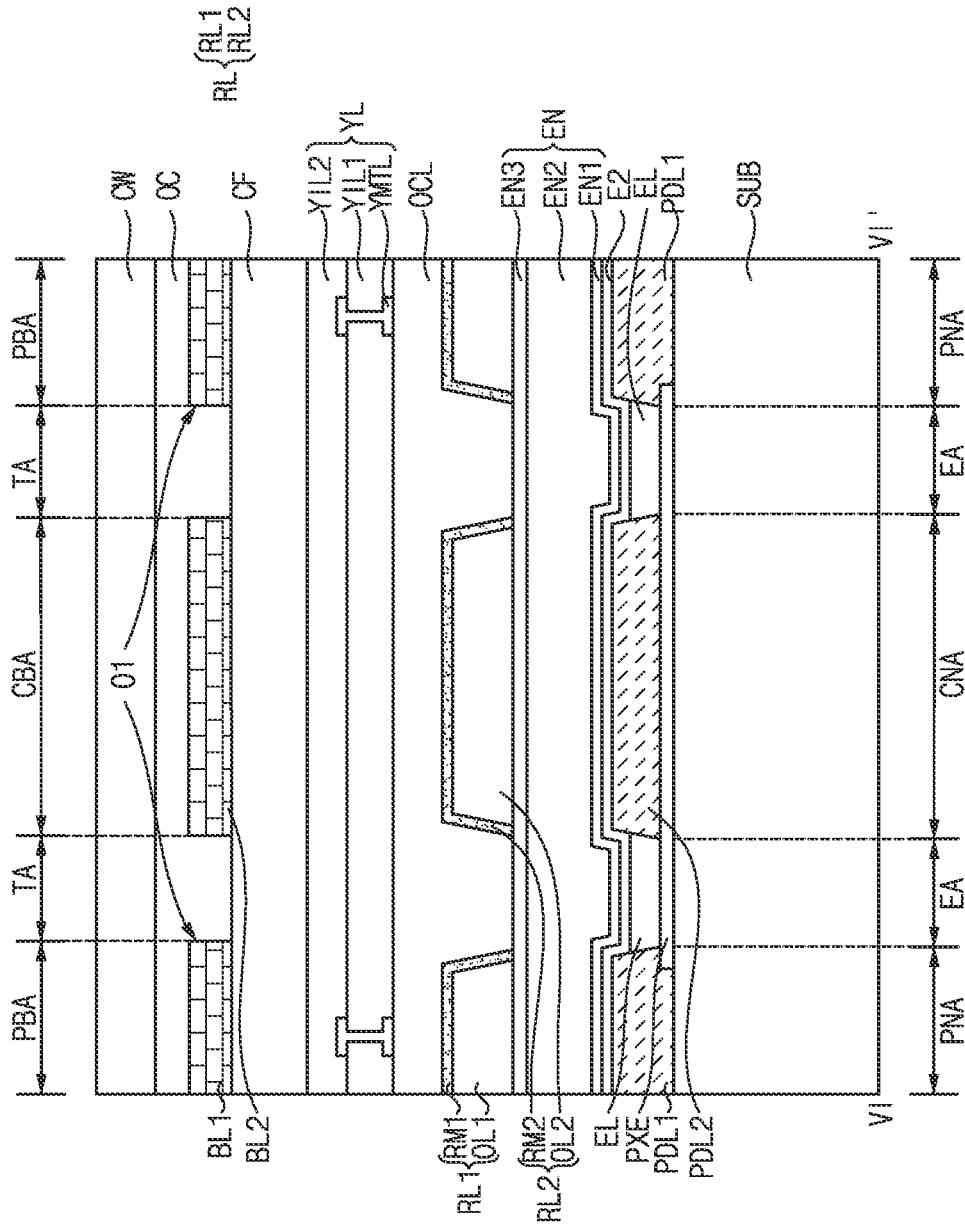

Referring to FIG. 18 and FIG. 19, a light blocking layer BL may be formed on the color filter layer CF. Specifically, forming the light blocking layer BL may include applying an organic light blocking material on the color filter layer CF, and etching a portion of the organic light blocking layer overlapping the emitting area EA to form a first light blocking layer BL1 and a second light blocking layer BL2.

After forming the light blocking layer BL, an over coating layer OC covering the first light blocking layer BL1 and the second light blocking layer BL2 and a cover window disposed on the over coating layer OC may be formed.

What is claimed is:

1. A display device, comprising:
a base substrate;
in order from the base substrate:
a light emitting element layer comprising a central non-emitting area, an emitting area surrounding the central non-emitting area, and a peripheral non-emitting area surrounding the emitting area;
an encapsulation layer covering the light emitting element layer; and
a light blocking layer, the light blocking layer comprising:
a first light blocking pattern defining a first opening of the light blocking layer which overlaps the emitting area of the light emitting element layer, and
a second light blocking pattern which is in the first opening of the light blocking layer and spaced apart from the first light blocking pattern in a direction along the encapsulation layer; and
a reflective layer between the encapsulation layer and the light blocking layer, the reflective layer comprising:
a first reflective pattern defining a second opening which overlaps the central non-emitting area and the emitting area of the light emitting element layer, and
a second reflective pattern which is in the second opening of the reflective layer and spaced apart from the first reflective pattern in the direction along the encapsulation layer.

2. The display device of claim 1, wherein the second light blocking pattern overlaps the central non-emitting area of the light emitting element layer.

3. The display device of claim 1, wherein the reflective layer directly contacts the encapsulation layer.

4. The display device of claim 3, wherein
each of the first reflective pattern and the second reflective pattern has a side surface extended from the encapsulation layer, and
the side surface of the first reflective pattern and the side surface of the second reflective pattern is inclined with respect to the encapsulation layer.

5. The display device of claim 1, wherein,
the first reflective pattern comprises a first organic layer and a first metal layer which faces the encapsulation layer with the first organic layer therebetween, and
the second reflective pattern comprises a second organic layer and a second metal layer which faces the encapsulation layer with the second organic layer therebetween.

6. The display device of claim 1, wherein the light emitting element layer further comprises:
the emitting area having a viewing angle,
a wide emitting area having a viewing angle larger than the viewing angle of the emitting area; and
a wide non-emitting area surrounding the wide emitting area.

7. The display device of claim 6, wherein within the light emitting element layer:
each of the wide emitting area and the emitting area has an area, and
the area of the wide emitting area is the same as the area of the emitting area.

8. The display device of claim 1, further comprising in order from the base substrate:
the encapsulation layer;
an organic covering layer covering the encapsulation layer;
a touch sensing layer; and
a color filter layer.

9. The display device of claim 8, wherein the light blocking layer directly contacts the color filter layer.

10. The display device of claim 1, wherein the light emitting element layer further comprises:
a pixel electrode on the base substrate;
a pixel defining layer comprising:
a first pixel defining pattern defining a pixel opening of the pixel defining layer which exposes the pixel electrode to outside the pixel defining layer, and defining the peripheral non-emitting area; and a second pixel defining pattern which is in the pixel opening of the pixel defining layer and spaced apart from the first pixel defining pattern, the second pixel defining pattern defining the central non-emitting area;

a light emitting layer which is on the pixel defining layer and between the first pixel defining pattern and the second pixel defining pattern, the light emitting layer defining the emitting area; and a common electrode on the light emitting layer.

11. A method of providing a display device, comprising:

providing a light emitting element layer comprising a central non-emitting area, an emitting area surrounding the central non-emitting area, and a peripheral non-emitting area surrounding the emitting area, on a base substrate;

providing an encapsulation layer covering the light emitting element layer;

providing a light blocking layer on the encapsulation layer, the providing of the light blocking layer defining:
    a first light blocking pattern defining a first opening of the light blocking layer which overlaps the central non-emitting area and the emitting area of the light emitting element layer, and
    a second light blocking pattern which is in the first opening and spaced apart from the first light blocking pattern; and providing a reflective layer on the encapsulation layer, the reflective layer comprising:
    a first reflective pattern defining a second opening of the reflective layer which overlaps the central non-emitting area and the emitting area of the light emitting element layer, and
    a second reflective pattern which is in the second opening and spaced apart from the first reflective pattern.

12. The method of claim 11, further comprising:

providing an organic covering layer on the encapsulation layer;

providing a touch sensing layer on the organic covering layer; and providing a color filter layer on the touch sensing layer.

13. The method of claim 11, wherein the providing of the light blocking layer comprises:

providing an organic light blocking material; and removing a portion of the organic light blocking material which overlaps the emitting area of the light emitting element layer.

14. The method of claim 11, wherein the second light blocking pattern overlaps the central non-emitting area of the light emitting element layer.

15. The method of claim 11, wherein the first reflective pattern comprises a first organic layer and a first metal layer which faces the encapsulation layer with the first organic layer therebetween, and the second reflective pattern comprises a second organic layer and a second metal layer which faces the encapsulation layer with the second organic layer therebetween.

16. The method of claim 11, wherein the providing of the light emitting element layer comprises:

providing a pixel electrode on the base substrate;

providing a pre-pixel defining layer covering the pixel electrode, on the base substrate;

providing a pixel defining layer by removing a portion of the pre-pixel defining layer which overlaps the emitting area of the light emitting element layer, to define:
    a first pixel defining pattern defining a pixel opening exposing the pixel electrode to outside the pixel defining layer and defining the peripheral non-emitting area of the light emitting element layer, and
    a second pixel defining pattern which is in the pixel opening and spaced apart from the first pixel defining pattern, the second pixel defining pattern defining the central non-emitting area of the light emitting element layer;

providing a light emitting layer on the pixel electrode and between the first pixel defining pattern and the second pixel defining pattern, the light emitting layer defining the emitting area of the light emitting element layer; and providing a common electrode on the light emitting layer.

17. A display device comprising:

a first pixel having a viewing angle;

a second pixel having a viewing angle narrower than the viewing angle of the first pixel;

each of the first pixel and the second pixel comprising:
    a light emitting element layer comprising a light emitting area having a planar area, and a non-emitting area which is adjacent to the light emitting area, and
    an encapsulation layer covering the light emitting element layer;

the planar area of the light emitting area of the first pixel is same as the planar area of the light emitting area of the second pixel; and a viewing angle control member defining the viewing angle of the second pixel which is narrower than the viewing angle of the first pixel, wherein the viewing angle control member comprises a light blocking layer in which a first opening is defined overlapping the light emitting area together with a reflective layer which is between the encapsulation layer and the light blocking layer and in which a second opening is defined overlapping the light emitting area.

18. The display device of claim 17, wherein the second pixel which has the viewing angle narrower than the viewing angle of the first pixel, further comprises:

a light blocking layer which faces the light emitting element layer and defines the non-emitting area of the light emitting element layer, and portions of the non-emitting area alternating with portions of the light emitting layer, in a direction along the light emitting element layer.

* * * * *